US005479321A

United States Patent [19]

Mair et al.

[11] Patent Number: 5,479,321

[45] Date of Patent: Dec. 26, 1995

[54] SHIELDED ELECTRICAL MOUNTING RACK

[75] Inventors: Eduard Mair; Gundolf Milde; Peter Sedlmeier, all of München, Germany

[73] Assignee: Siemens Aktiengesellschaft, Munich, Germany

[21] Appl. No.: 392,735

[22] PCT Filed: Aug. 17, 1993

[86] PCT No.: PCT/EP93/02192

§ 371 Date: Feb. 27, 1995

§ 102(e) Date: Feb. 27, 1995

[87] PCT Pub. No.: WO94/06179

PCT Pub. Date: Mar. 17, 1994

[30] Foreign Application Priority Data

Aug. 31, 1992 [EP] European Pat. Off. .............. 92114863

[51] Int. Cl.$^6$ ........................ H05K 9/00

[52] U.S. Cl. .......................... 361/816; 361/818; 361/800; 361/796; 439/607; 439/610

[58] Field of Search .................................... 361/800–802, 361/816, 818, 796, 799; 439/62, 79, 80–83, 60, 61, 59, 607–610, 567, 108

[56] References Cited

U.S. PATENT DOCUMENTS

| | | | |
|---|---|---|---|
| 4,808,115 | 2/1989 | Norton et al. | 439/79 |
| 4,869,677 | 9/1989 | Johnson et al. | 439/80 |
| 5,192,228 | 3/1993 | Collins et al. | 439/567 |
| 5,307,242 | 4/1994 | Seibold et al. | 361/816 |
| 5,316,501 | 5/1994 | Mair | 439/607 |

FOREIGN PATENT DOCUMENTS

| | | |
|---|---|---|
| 0323114 | 7/1989 | European Pat. Off. . |
| 0456856 | 11/1991 | European Pat. Off. . |
| WO92/08261 | 5/1992 | WIPO . |

*Primary Examiner*—Leo P. Picard
*Assistant Examiner*—Y. Whang
*Attorney, Agent, or Firm*—Hill, Steadman & Simpson

[57] ABSTRACT

A shielded mounting rack has a shielding plate (11) on its rear, which shielding plate (11) covers the back-panel wiring and is provided with apertures (12) for shielded plug connectors (1) which can be plugged on at the rear. The latter are in each case provided with a shielding casing (3) which has feathered contact tongues (4) which make contact with circumferential ground contact pins (10) on a back-panel wiring board (8). The ground contact pins (10) project into the apertures (12) in the shielding plate (11) and are pressed, by the contact tongues (4), against its inner wall. As a consequence, a fine-meshed ground connection is produced between the plug connector (1), the shielding plate (11) and the back-panel wiring (8).

3 Claims, 1 Drawing Sheet

SHIELDED ELECTRICAL MOUNTING RACK

BACKGROUND OF THE INVENTION

The invention relates to a shielded electrical mounting rack having back-panel wiring which has contact pins for plug connectors, for example cable plugs, which can be plugged on at the rear, the plug connectors being sheathed by a shielding plate which is provided with circumferential feathered spring contacts, which can be made contact with by grounded contact pins of the back-panel wiring.

Such a structure has been disclosed, for example, by the documents in German Utility Patent G 90 15 255 (U.S. Pat. No. 5,316,501). As a result of the grounded contact pins being closely distributed, they form an additional shielding casing which bridges the distance between the cable plug and the back-panel wiring board.

SUMMARY OF THE INVENTION

The invention is based on the object of improving the making of the contact with the contact pins, and the shielding effect.

This object is achieved by the invention and in general terms is a shielded electrical mounting rack having back-panel wiring which has contact pins for plug connectors, for example, cable plugs, which can be plugged on at the rear. The plug connectors are surrounded by a shielding casing which is provided with circumferential contact tongues which are like leaf springs, the contact tongues can make contact with ground contact pins on a back-panel wiring board in the back-panel wiring. The mounting rack has a shielding plate which covers the back-panel wiring and is provided with apertures for the plug connectors. The ground contact pins for the contact tongues project into the apertures and can be pressed there, by the contact tongues, against the inner walls of the apertures. Unshielded wires which are laid on the rear of the back-panel wiring board and are inside the mounting rack are shielded by the shielding plate. In the case of mounting racks onto which, for example, plug cables can be plugged from the rear, these individual wires were until now protected only by the back panel of a housing cabinet into which the mounting rack is inserted. In this case, it was possible for interference radiation to occur between the individual mounting racks. The shielding plate is provided with apertures, for example at all the points at which plugs can be arranged. Spare apertures can be closed, for example, by covering caps which are of similar construction to the shielding casing of the plug connection.

Since the contact pins are now supported on the inner wall of the aperture, they can no longer be deflected when the plug connector is plugged on and when, in so doing, the feathered contact tongues strike against the contact pins. In this case, the contact force between the contact tongues and the contact pins is increased, as a result of which better contact is made. This, on its own, produces an improved shielding effect. This is still further improved in that a direct contact is produced between the grounded contact pins and the shielding plate.

According to an advantageous development of the invention, the grounded contact pins make contact with at least one shielding layer on a back-panel wiring board. As a consequence, a fine-meshed ground connection is produced between the plug shield, the shielding plate and the ground layers of the back-panel wiring, as a result of which the overall shielding is still further enhanced.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several figures of which like reference numerals identify like elements, and in which:

DESCRIPTION OF THE PREFERRED EMBODIMENTS

Figure 1:
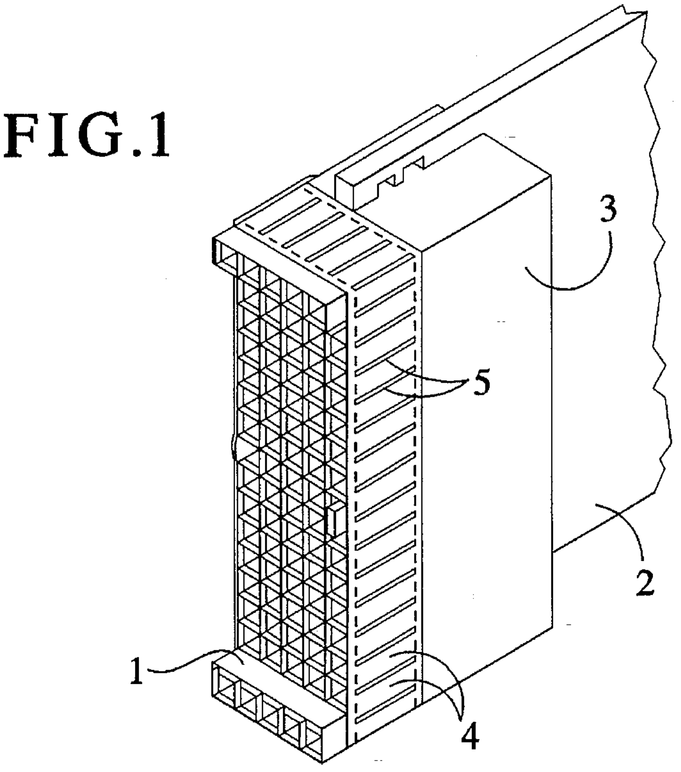
FIG. 1 shows a perspective view of a multipole plug connector having a printed circuit board and a shielding casing.

According to FIG. 1, a multipole plug connector 1 is fitted onto a printed circuit board 2 to which, for example, one or more cables can be connected. The plug connector has a feathered shielding casing 3 which largely encloses the plug connector 1, with the exception of its insertion side. The shielding casing 3 is produced from strip material, which is provided with a bulge extending in its longitudinal direction. This bulge has a large number of closed transverse slots 5, between which the shielding casing 3 forms contact tongues 4 which are like leaf springs and extend essentially in the insertion direction. The contact tongues 4 are located in the vicinity of the insertion side of the plug connector 1.

Figure 2:
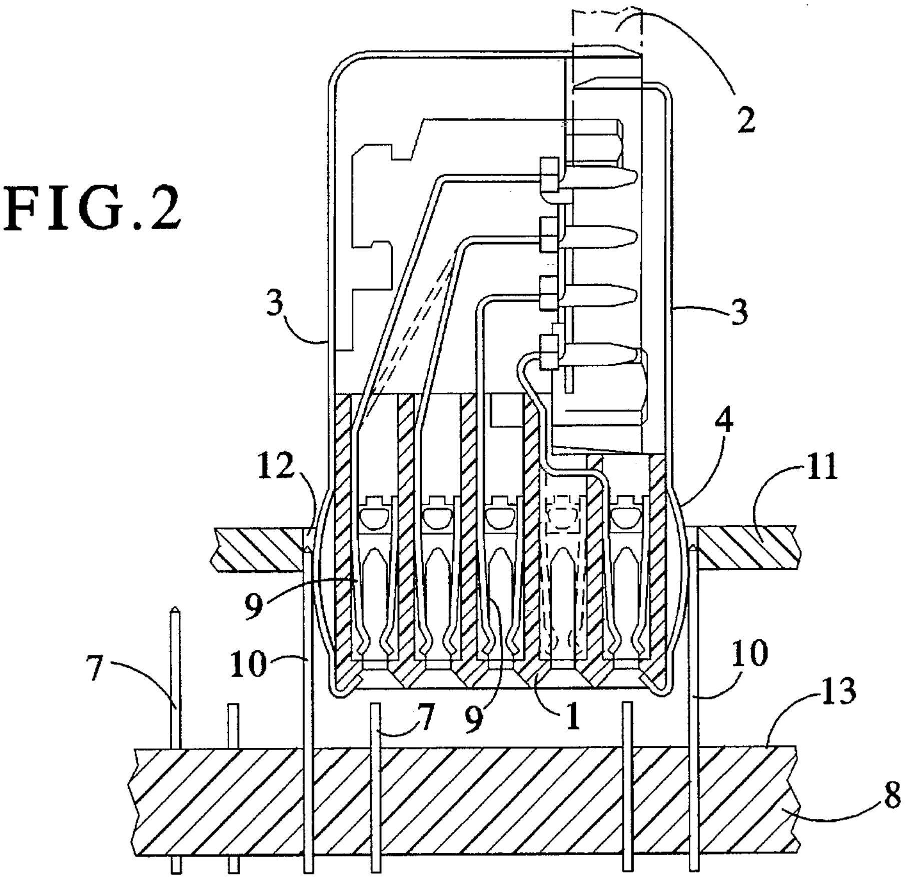
FIG. 2 shows a cross section through the plug connector according to FIG. 1, which is plugged onto back-panel wiring of a mounting rack.

According to FIG. 2, the plug connector 1 is plugged onto contact pins 7 on a back-panel wiring board 8. The contact tongues 4 are located in the vicinity of contact springs 9 of the plug connector 1 and make contact with adjacent ground contact pins 10 on the back-panel wiring board 8. The ground contact pins 10 are extended beyond the contact pins 7. A shielding plate 11 of the mounting rack extends at the level of the tips of the ground contact pins 10, above the ends of the contact pins 7. This shielding plate 11 is provided with apertures 12 for the plug connector 1 and the adjacent ground contact pins 10. The latter project into the apertures 12 and rest against their inner wall. The contact tongues 4 rest against the ground contact pins 10 from the opposite side and are subject to spring stress so that they are pressed, in a corresponding manner, against the inner wall of the apertures 12.

In addition to the grounded shielding plate 11, the ground contact pins 10 make contact with ground layers 13 on the back-panel wiring board, as a result of which a fine-meshed connection multiple connections is produced between the shielding casing 3, the shielding plate 11 and the back-panel wiring board 8.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A shielded electrical mounting rack having back-panel wiring which has contact pins for plug connectors, which are plugged on a rear side of the mounting rack, comprising: plug connectors surrounded by a shielding casing which is provided with circumferential contact tongues which make contact with ground contact pins on a back-panel wiring board in the back-panel wiring a shielding plate which covers the back-panel wiring and which is provided with apertures for the plug connectors the ground contact pins for the contact tongues projecting into the apertures and being pressed there, by the contact tongues, against inner walls of the apertures.

2. The mounting rack as claimed in claim 1, wherein the ground contact pins make contact with at least one ground layer on the back-panel wiring board.

3. The mounting rack as claimed in claim 1, wherein the contact tongues are leaf springs.

* * * * *